US 6,707,855 B2
(12) United States Patent
Patana

(10) Patent No.: US 6,707,855 B2
(45) Date of Patent: Mar. 16, 2004

(54) DIGITAL DELTA SIGMA MODULATOR IN A FRACTIONAL-N FREQUENCY SYNTHESIZER

(75) Inventor: Jari Petri Patana, Vantaa (FI)

(73) Assignee: Nokia Corporation, Espoo (FI)

( * ) Notice: Subject to any disclaimer, the term of this patent is extended or adjusted under 35 U.S.C. 154(b) by 90 days.

(21) Appl. No.: 10/177,648

(22) Filed: Jun. 20, 2002

(65) Prior Publication Data

US 2003/0235261 A1 Dec. 25, 2003

(51) Int. Cl.$^7$ ............................................... H03M 3/00
(52) U.S. Cl. ........................................ 375/244; 341/143
(58) Field of Search ............................... 375/244, 373, 375/376; 332/127; 341/143

(56) References Cited

U.S. PATENT DOCUMENTS

| | | | | |
|---|---|---|---|---|
| 4,179,670 A | * | 12/1979 | Kingsbury | 331/10 |
| 5,903,194 A | * | 5/1999 | Opsahl et al. | 331/1 A |
| 6,060,950 A | | 5/2000 | Groe | |
| 6,219,397 B1 | * | 4/2001 | Park | 375/376 |

OTHER PUBLICATIONS

Rhee et al, "A 1.1 Ghz CMOS Fractional_N Frequency Synthesizer with a 3b 3$^{rd}$–order delta–sigma Modulator", 2000, IEEE International Solid–state Circuits Conference, p. 199.*

"A Multiple Modulator Fractional Divider" by B.Miller and R.J. Conley, IEEE Transactions on Instrumentation and Measurement, vol. 40, No. 3, Jun. 1991 (pp. 578–583).

"Delta–Sigma Modulation in Fractional–N Frequency Synthesis" by T.A.D.Riley, M.A.Copeland and T.A.Kwasniewski, IEEE Journal of Solid–State Circuits, vol. 28, No. 5, May 1993 (pp. 553–559).

"Techniques for High Date Rate Modulation and Low Power Operation of Fractional–N Frequency Synthesizers" by M.H.Perrott, Copyright 1997 Massachusetts Institute of Technology, Sep. 1997 (cover page and pp. 119–122).

"Design and Realization of a Digital ΔΣ Modulator for Fractional–n Frequency Synthesis" by T.P.Kenny, T.A.D.Riley, N.M.Filiol and M.A.Copeland, IEEE Transactions on Vehicular Technology, vol. 48, No. 2, Mar. 1999 (pp. 510–521).

* cited by examiner

Primary Examiner—Stephen Chin
Assistant Examiner—Kevin Kim
(74) Attorney, Agent, or Firm—Ware, Fressola, Van Der Sluys & Adophson LLP

(57) ABSTRACT

A digital delta-sigma modulator for controlling a multi-modulus divider in a fractional-N frequency synthesizer features cascaded delta-sigma modulator stages in a feed-forward circuit topology to extend the possible multi-modulus control output values between the range of −1 to +1. A direct input receives an N-bit input control word which can be dithered, for example, by a sinewave in a two's complement format. The digital delta-sigma modulator can be of any type and includes cascaded accumulators and pipelined accumulator topologies.

13 Claims, 4 Drawing Sheets

DIGITAL DELTA SIGMA MODULATOR IN A FRACTIONAL-N FREQUENCY SYNTHESIZER

TECHNICAL FIELD

The present invention relates generally to delta-sigma modulator based fractional-N phase locked loop frequency synthesizers and deals more particularly with a digital delta-sigma modulator for controlling a multi-modulus frequency divider in the feedback path of the phase locked loop.

BACKGROUND OF THE INVENTION

Digital frequency synthesizers have long been used in communication systems, particularly RF communication systems, to generate RF signals carried over RF channels. In frequency synthesis, it is desirable to achieve the selected frequency output in as little time as possible with any spurious output frequencies minimized. It is known to create a frequency synthesizer by placing a frequency divider function between the voltage-controlled oscillator (VCO) output and the phase frequency detector (PFD) in a phase-locked loop (PLL), wherein the VCO output frequency is an integer-N multiple of the input reference frequency to the PFD. The spurious outputs in question are usually associated with phase detectors and occur at the phase detector operating frequency, which is generally the same as the channel spacing. Incorporating a fractional-N division function in the PLL provides a number of advantages and helps overcome problems of spurious frequency outputs by allowing the phase detector to operate at a much higher frequency for the same channel spacing.

A number of methods are known that are based upon the concept of integer-N frequency synthesis to realize the fractional-N division function and include pulse swallowing, phase interpolation, Wheatly random jittering and delta-sigma modulation to control the multi-modulus, including dual-modulus, frequency dividers to provide the division function. Of the known methods, a delta-sigma modulator realization of a fractional-N frequency synthesizer is desirable and preferable to achieve low phase noise, fast settling time, fine channel resolution and wide tuning bandwidth. The delta-sigma modulator fractional-N frequency synthesizer is based on the concept of division ratio averaging, wherein an integer frequency divider rather than a fractional frequency divider is used. The division ratio is dynamically switched between two or more values, effectively providing a non-integer number division function. One of the most important advantages of using the delta-sigma modulator to control a multi-modulus divider is the ability to shape phase noise introduced by the delta-sigma modulator controlled fractional-N division function. A problem generally associated with such a delta-sigma modulator fractional-N frequency synthesizers is the appearance or presence of fractional spurious levels at a fractional offset frequency. The fractional spurious levels may also appear at the fractional offset frequency harmonics. The fractional spurious levels in delta-sigma modulator based fractional-N frequency synthesizers may originate from several sources including the operation of the delta-sigma modulator itself, coupling between the multi-modulus prescaler or charge pump driving the loop filter and the outside world through power supply feeds or substrates, and the nonlinearity of the charge pump. The fractional spurious frequencies may also originate from the spacing error or timing error of the multi-modulus prescaler.

It would be desirable therefore to provide a delta-sigma modulator in a fractional-N frequency synthesizer that achieves low phase noise, fast settling time, fine channel resolution and wide tuning bandwidth.

It is an object therefore of the present invention to provide a digital delta-sigma modulator in a phase locked loop fractional-N frequency synthesizer that provides an increased multi-modulus input control range.

It is another object of the present invention to provide a digital delta-sigma modulator in a phase locked loop fractional-N frequency synthesizer wherein the desired fraction multi-modulus control input signal is generated in the interval between −1 and +1.

It is a further object of the present invention to provide a digital delta-sigma modulator in a phase locked loop fractional-N frequency synthesizer wherein the desired frequency is achieved by adding a fractional frequency to an integer frequency less than the desired frequency or subtracting a fractional frequency from an integer frequency greater than the desired frequency.

It is a still further object of the present invention to provide a digital delta-sigma modulator having a direct input for a modulation data signal in a two's complement format.

It is a yet further object of the present invention to provide a digital delta-sigma modulator wherein the modulation data signal is processed in the modulator for use as a direct modulation fractional-N frequency synthesizer.

SUMMARY OF THE INVENTION

One advantage of the delta-sigma modulator embodying the present invention, as further described hereinbelow, is a modulation data signal, a dithering signal or a sum of different signals can be directly connected to the input of the modulator.

A further advantage of the delta-sigma modulator of the present invention is a desired or a selected channel frequency can be achieved by adding or subtracting a fractional component part to or from an integer component part of the desired frequency wherein the fractional component part can be set at any value between −1 and +1.

Another advantage of the delta-sigma modulator of the present invention is the modulation data signal or dithering signal can be directly connected to the input in a two's complement format.

A still further advantage of the delta-sigma modulator of the present invention is the dithering signal can be a sinewave in two's complement format.

A yet further advantage of the delta-sigma modulator of the present invention is the input signal in two's complement format can be the sum of all or any combination of the modulation data signal or dithering signal including the fractional component part.

In accordance with a first aspect of the invention, a digital delta-sigma modulator for controlling a multi-modulus divider in a fractional-N frequency synthesizer includes a plurality of delta-sigma modulator stages cascaded in a feed-forward circuit topology and the number of stages define an Nth order delta-sigma modulator. The modulator has a direct connection input means for receiving a N-bit input control word defining a desired frequency for selection. The desired frequency is broken down to have an integer component part and a fractional component part. The modulator also has sign-bit input means for receiving a direction signal indicating the desired frequency selected by adding the fractional component part to the integer part or by subtracting the fractional component part from the integer part. Logic means coupled to the delta-sigma modulator stages are provided for detecting and determining the amount and direction of a frequency from the desired frequency to produce a weighted M-bit output multi-modulus divider control word.

Preferably, the feed forward cascaded circuit topology comprises a cascaded sequence of delayed accumulators.

Preferably, the feed forward cascaded circuit topology comprises a pipelined accumulator topology wherein the input control word is pipe shifted and the output control word is align shifted.

Preferably, the logic means further comprises timing compensation registers in the carry overflow signal output of the accumulator and differentiation circuit means for performing a differential calculation on the carry overflow signal output.

Preferably, the differentiation circuit means comprise a cascaded sequence of differentiators.

Preferably, the N-bit input control word is in a two's complement format.

Preferably, the N-bit input control word is dithered to produce an average zero dither N-bit input control word.

Preferably, the N-bit control word is dithered as a sine wave signal in a two's complement format.

In accordance with another aspect of the invention, a delta-sigma modulator for controlling a multi-modulus divider in a fractional-N frequency synthesizer includes a plurality of cascaded feed forward accumulators wherein the number of accumulators is the order of the delta-sigma modulator. Although described as a third order delta-sigma modulator, the design considerations and implementation apply to higher orders as well. The first accumulator includes a first input for receiving an N-bit modulation data signal representative of a desired channel frequency selection and a second input for receiving a SIGN-bit control word representative of the direction for adding or subtracting a frequency offset to a fixed frequency to generate the frequency corresponding to the desired selected channel frequency. The first accumulator includes a feed forward output coupled to the input of a first next following accumulator, a first carry signal C1 output indicative of an overflow or underflow condition, and a SIGN bit signal output indicative of the direction of the overflow. The first carry signal C1 and the SIGN bit signal are logically combined in logic means and a first logic output control word is generated. The first next following accumulator includes a feed forward output coupled to the input of a second next following accumulator, and a second carry signal C2 output indicative of an overflow or underflow condition. The second next following accumulator includes a feed forward output coupled to a feedback input, and a third carry signal C3 output indicative of an overflow or underflow condition. The carry output signals C2 and C3 from the first next following and second next following accumulators, respectively are summed such that the carry output signals add to a net summation equal to zero so as to not affect the fractional control word input. The resultant carry output signal C2 and C3 summation is added to the first logic output control word to provide a multi-modulus division function control word.

Preferably, the N-bit modulation data signal is in a two's complement format.

In a further aspect of the invention, each of the feed forward outputs are coupled through a respective delay register, and the first carry signal C1 and the SIGN bit signal output are coupled through a first and second plurality of delay registers, respectively. The second carry signal C2 is coupled through a third plurality of delay registers and the third carry signal C3 is coupled through a fourth plurality of delay registers.

BRIEF DESCRIPTION OF THE DRAWINGS

Other features, benefits and advantages of the delta-sigma modulator of the present invention will become readily apparent from the following written description of exemplary embodiments taken in conjunction with the drawings, wherein.

DETAILED DESCRIPTION OF PREFERRED EMBODIMENTS

Figure 1:
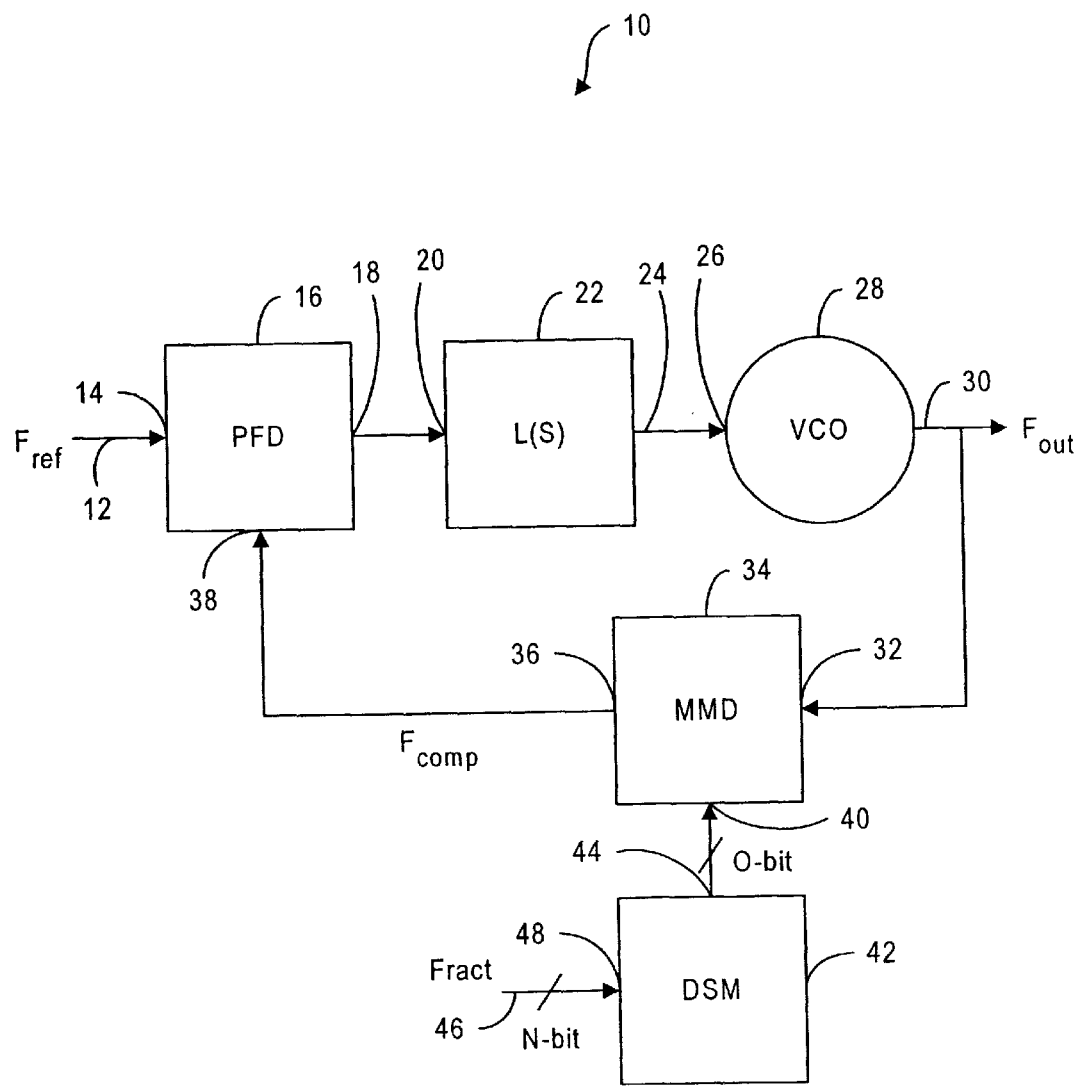
FIG. 1 is a schematic functional block diagram showing a delta-sigma based fractional-N phase locked loop frequency synthesizer.

Turning now to the drawings and first considering FIG. 1 to gain a better understanding of the invention, a schematic functional block diagram of a representative delta-sigma modulator based fractional-N phase locked loop frequency synthesizer is illustrated therein and generally designated 10. The delta-sigma fractional-N frequency synthesizer 10 comprises a phase frequency detector (PFD) 16, a loop filter 22, and a voltage-controlled oscillator (VCO) 28. A reference frequency $F_{ref}$ at the input 12 to the frequency synthesizer 10 is applied to the input 14 of the PFD 16. A multi-modulus frequency divider 34 is located in the feedback loop between the VCO output 30 and an input 38 of the PFD 16. The output 18 of the PFD 16 is coupled to the input 20 of the loop filter 22. The loop filter 22 functionally operates as an integrating capacitor. The output 24 of the loop filter 22 is coupled to the VCO input 26. The VCO 28 generates a frequency signal $F_{out}$ at the VCO output 30 in response to the signal at its input 26. The frequency $F_{out}$ at the VCO output 30 is coupled to the input 32 of the multi-modulus frequency divider (MMD) 34. The multi-modulus frequency divider 34 is also coupled to and controlled by a delta-sigma modulator (DSM) designated generally 42. The control output 44 of the DSM 42 is coupled to the control input 40 of the MMD 34. The output 36 of the multi-modulus frequency divider 34 is connected to the input 38 of the PFD 16. The signal $F_{comp}$ at the input 38 to the PFD 16 is representative of the loop phase error, that is, the difference in phase between the frequency $F_{out}$ and the input frequency $F_{ref}$. The output signal $F_{comp}$ from the MMD 34 is the phase of the VCO output signal $F_{out}$ divided by the fractional divider or multi-modulus divider division factor M ($F_{comp}=F_{out}/M$), which is controlled by the DSM 42. The difference in phase between the frequency $F_{comp}$ and frequency $F_{ref}$ is produced in the output 18 of the PFD 16. In actuality, the output signal 36 of MMD 34 is a clock signal and the PDF 16 measures the difference between the rising edge of the $F_{comp}$ signal and the rising edge of the $F_{ref}$ signal. Also, the phase difference can be produced using the falling clock edge of the $F_{comp}$ and $F_{ref}$ signals. The PFD 16 is commonly shown in the art as two separate function blocks: a phase detector (PD) and a charge pump (CP) and the reader is referred to text books, literature, data sheets and other information readily available for further explanation of the PFD operation. The PFD 16 measures the phase difference and adjusts (advances or retards) the phase of the VCO 28 and thus the frequency $F_{out}$ produced by the VCO. The frequency $F_{out}$ at the VCO output 30 is related to the input reference frequency $F_{ref}$ by a scaling factor as determined by the MMD 34.

The frequency $F_{out}$ at the VCO output 30 is a fraction of the input reference frequency $F_{ref}$. Since the MMD 34 in actuality is not dividing by a fractional division ratio, but rather an integer value, the fractional-N frequency synthesis is achieved through division ratio averaging, that is, the division ratio is dynamically switched between two or more values, effectively causing the divider to divide by a non-integer number. In FIG. 1, the DSM 42 controls the division ratio of the MMD 34 in accordance with information in an N-bit control word $F_{ract}$ on input line 46 coupled to the input 48 of the DSM 42. For purposes of understanding in FIG. 1, the input control word $F_{ract}$ includes all the necessary information to be provided to the multi-modulus frequency divider including any pre-dividers. Likewise, the multi-modulus frequency divider may take on different forms and implementations and for purposes of explanation in FIG. 1, the multi-modulus frequency divider produces the loop phase error signal $F_{comp}$. The clock signal of the DSM 42 is not shown in FIG. 1, however it can be $F_{ref}$, $F_{comp}$ or an even faster clock signal wherein the maximum clock frequency $F_{max}$ is the VCO output frequency $F_{out}$. As discussed further herein, it is preferable to use the $F_{comp}$ clock signal as the clock signal which insures the output signal of the DSM is correctly synchronized with the MMD.

The shape, spurious level and spurious content of the output spectrum of the fractional-N frequency synthesizer is directly dependent upon the order of the digital delta-sigma modulator. The output noise spectral density of higher order digital delta-sigma modulators is shown to monotonically increase at greater rates and shift quantization noise to higher frequencies. The higher out-of-band noise level is suppressed by using a loop filter which is set one order higher than the order of the delta-sigma modulator. The higher order digital delta-sigma modulators increase the complexity of the circuits, chip size and power consumption. There are a number of considerations that must be taken into account to improve the performance and minimize the fractional spurious levels. Better fractional spurious performance is achieved in some instances when a smaller channel step is used, which is achieved by adding bits to the accumulator. The result is a slight shifting of the desired channel in the wrong direction. A better solution to reduce fractional spurious levels produced by higher order delta-sigma modulators is to randomize the static input with a pseudo-random signal, such as a dithering pattern. The randomization produces the desired average value and only creates quantization noise with minimal spurious content. However, depending upon the statistical properties of the dither used, the quantization noise can be many times worse than in the undithered case. Additionally, it is not possible to obtain the correct fractional offset if long pseudo-random sequences compared to the sampling frequency are fed into the delta-sigma modulator. Although it is possible add a dither signal in an attempt to reduce fractional spurious levels, which is on the positive side for example by the sequence 8 16 8 16 and so on, causes a fixed fractional error. In this case, the average value is known and the effect of it on the desired channel frequency can be calculated beforehand and compensated for. However, if the desired channel frequency is near the integer channel frequency (for example, the fractional is 0.999), then it is not possible to add the dither signal for example above.

It should be made clear that the function of the delta-sigma modulator is to produce or generate a long pseudo random stream of numbers averaging to a fraction equal to the desired fractional ratio. The concept of the present invention to provide a direct input to receive a control signal in two's complement including an integer component part and a fractional component part having a value between −1 and +1 is intended for use with known and future developed types of delta-sigma modulators regardless of design or implementation or order. For example, the delta-sigma modulator of any order may be implemented using a pipe-lined accumulator topology wherein the input signal is placed in the "pipe shifted domain", passed through any desired number of cascaded pipelined adder and/or accumulator stages and align shifting the output signal. The appropriate required delays are introduced along the cascaded stages as required to provide the output signal. The reader is referred to textbooks and literature in the art for additional information and details of pipelined implemented delta-sigma modulators. The inventor's concept extends the range of the delta-sigma modulator to a negative value with the addition of a relatively small number of logic gates more than a conventional design. Thus, the digital delta-sigma modulator of the present invention is economical, efficient and practical to implement to achieve the desired benefits.

Figure 2:
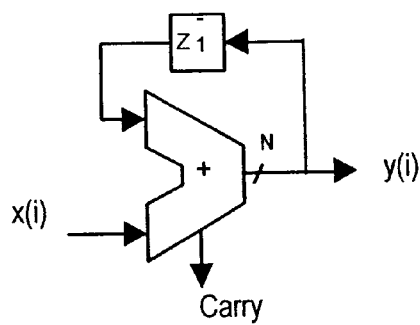
FIG. 2 is a schematic representation of a basic accumulator structure.
Figure 4:
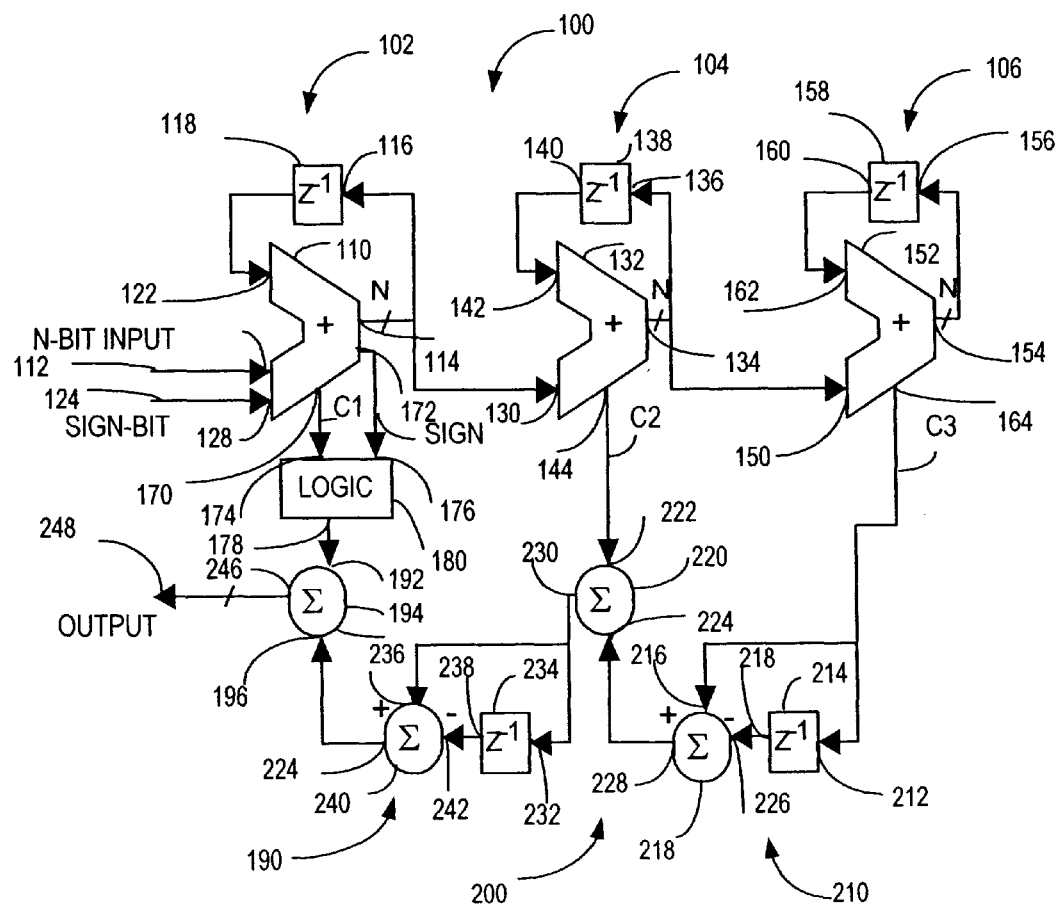
FIG. 4 is a schematic diagram showing a $3^{rd}$ order delta-sigma modulator frequency synthesizer embodying the present invention.
Figure 6:
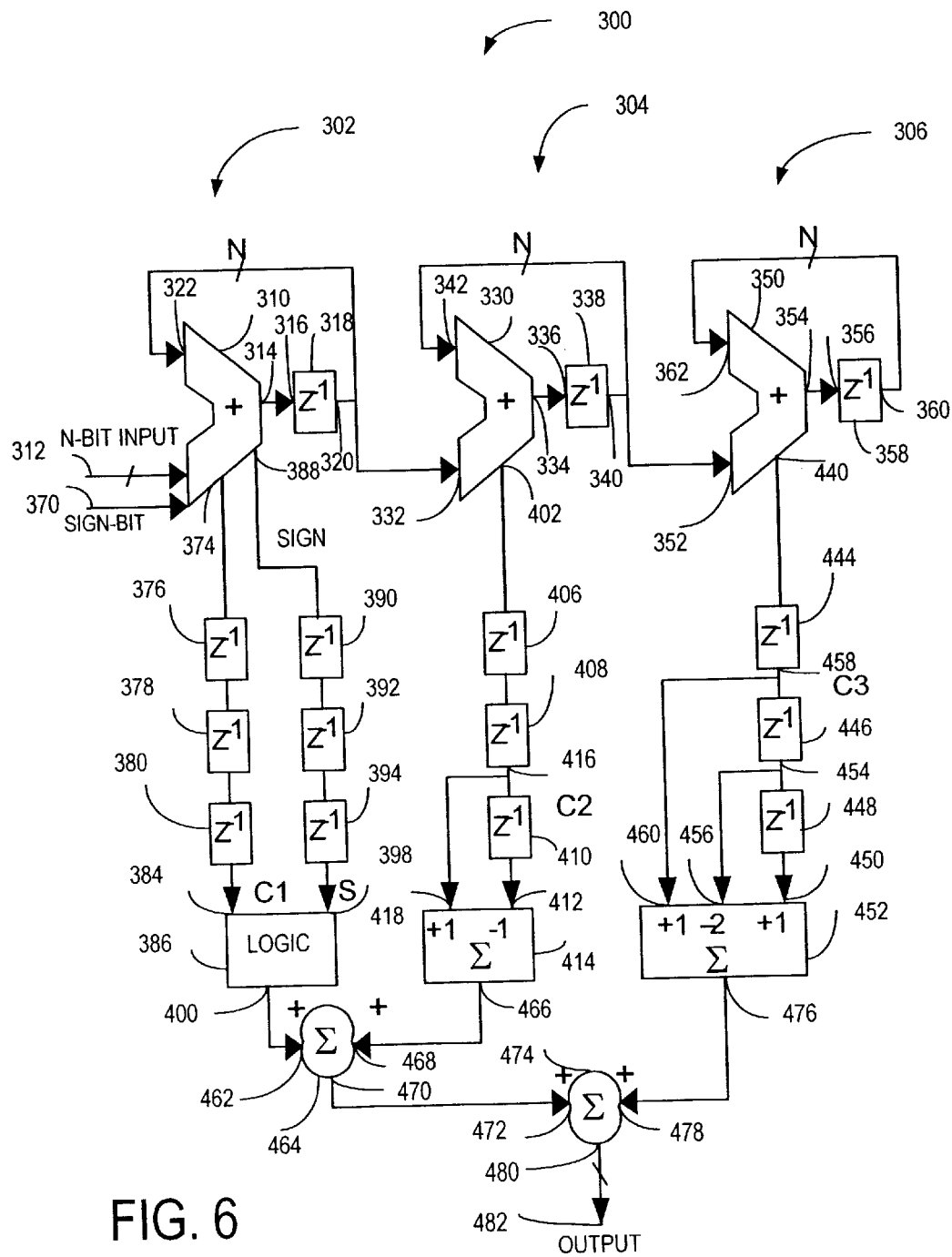
FIG. 6 is a schematic diagram showing an alternate embodiment of a $3^{rd}$ order delta-sigma modulator frequency synthesizer embodying the present invention.

Prior to describing several specific exemplary embodiments of the invention in FIGS. 4 and 6, a brief explanation of the design reasoning follows to assist in the understanding of the invention. FIG. 2 shows a basic accumulator architecture and has no delay in the feed forward path and is generally limited to use in low frequency applications only. The accumulator shown in FIG. 2 is configured as an integrator and is defined by the equation:

$y(i)=x(i)+y(i-1)$

The transfer function of the integrator in FIG. 2 in the z-domain is given as:

$H(z)=1/(1-z^{-1})$.

Figure 3:
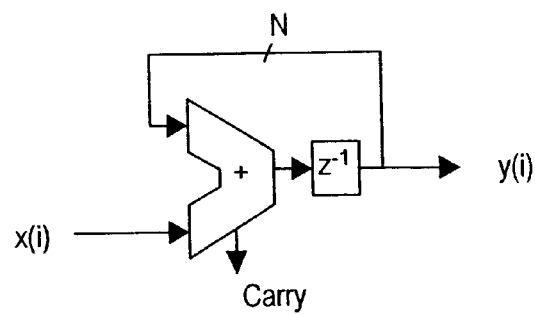
FIG. 3 is a schematic representation of a delayed accumulator structure.

FIG. 3 illustrates an accumulator structure that is better suited for high frequency applications in which a register is placed in the feed forward path. The structure in FIG. 3 can be referred to as a "delayed accumulator" because the phase error signal passed to the next accumulator is delayed. When used in the digital delta-sigma modulator examples below, it will be seen that no delay is added to the output of the modulator. The result here is the signal passed from the accumulator is delayed one clock cycle. The "delayed accumulator" shown in FIG. 3 is defined by the equation:

$y(i)=x(i-1)+y(I-1)$ and the transfer function is given as:

$H(z)=z^{-1}/(1-z^{-1})$.

Turning to FIG. 4, an exemplary embodiment of digital delta-sigma modulator of the present invention is illustrated therein and generally designated 100. The delta-sigma modulator 100 is a third order modulator and is comprised of three cascaded first order delta-sigma modulators designated generally 102, 104 and 106. It will be understood the modulator can be of any desired order modulator. The third order delta-sigma modulator shown in FIG. 4 has no delay in the forward path and can only be used in low frequency applications. The N-bit input control word corresponding to the desired channel or frequency band appears at the input line 112 and is coupled to the input 108 of the accumulator 110 comprising the delta-sigma modulator 102. The output 114 of the accumulator 110 is also coupled to the input 116 of a register 118. The output 120 of the register 118 is coupled to the input 122 of the accumulator 114. The output 114 of the accumulator 110 is coupled to the input 130 of the accumulator 132 in the second cascaded delta-sigma modulator 104. The output 134 of the accumulator 132 is also coupled to the input 136 of the register 138. The output 140 of the register 138 is coupled to the input 142 of the accumulator 132. The output 134 of the accumulator 132 is coupled to the input 150 of the accumulator 152 forming the third cascaded delta-sigma modulator 106. The output 154 of the accumulator 152 is coupled to the input 156 of the register 158. The output 160 of the register 158 is coupled to the input 162 of the accumulator 152.

The SIGN bit input signal on the lead 124 is used in the selection of the desired channel and is coupled to the input 128 of the accumulator 110. The desired channel for example, a channel corresponding to 100.25 can be selected in two different ways or from two different direction; for example, 100+0.25 or 101−0.75, to select the channel 100.25. The transmitted modulation data information is presented in a two's complement format to the input 124, wherein the most significant bit (MSB) is the SIGN bit. The carry signal C1 at the output 170 of the accumulator 110 indicates an overflow or an underflow situation and the carry output signal is presented at the input 174 of the logic function means 180. The direction of the overflow is presented at the output 172 of the accumulator 110 as a SIGN bit and is coupled to the SIGN input 176 of the logic function means 180, where the SIGN bit signal is logically combined with the carry signal and is presented at the output 178. An underflow condition is indicated by a "−1"; an overflow situation is indicated by a "+1"; and a normal situation or function is presented as "0". The output 178 of the logic function 180 is coupled to the input 192 of a differentiator 194 in the cascaded differentiation stage designated generally 190. The signal at the input 192 of the differentiator 194 is combined with the resultant signal at the input 196, resulting from the combination of the cascaded differentiators from the second cascaded differentiation stage designated generally 200 and the third cascaded differentiation stage designated generally 210. The carry signal C2 at the output 144 of the accumulator 132 is coupled to the input 222 of the differentiator 220, where the accumulator output signal is combined with the resultant differentiation signal from the third cascade stage 210 and coupled to the input 224 of differentiator 220.

The carry signal C3 at the output 164 of the accumulator 152 of the third cascaded stage delta-sigma modulator 106 is coupled to the input 212 of the register 214 and the input 216 of the differentiator 218. The output 218 of the register 214 is coupled to the input 226 of the differentiator 218, where the register output signal is combined with the carry signal C3 at the input 216. The resultant signal at the output 228 of differentiator 218 is coupled to the input 224 of the differentiator 220 where the resultant signal is combined with the carry signal C2 from the second cascaded stage delta-sigma modulator accumulator 132. The signal at the output 230 of the differentiator 220 is coupled to the input 232 of the register 234 and to the input 236 of the differentiator 240. The output 238 of the register 234 is coupled to the input 242 of the differentiator 240, where the register output signal is combined with the resultant signal from the differentiator output 230 of the second cascaded differentiator 200. The resultant signal at the output 244 of the differentiator 240 is coupled to the input 196 of the differentiator 194, where the resultant signal is combined with the output logic signal from the logic function means 180 to provide a multi-modulus divider control signal at the output 246. The differentiator output 246 is coupled to the delta-sigma modulator output control lead 248. By using an exclusive "OR"-gate inside the first accumulator 110 and an "AND"-gate in the logic function means 180, the digital delta-sigma modulator 100 is implemented with a minimum of additional logic gates.

When the exclusive "OR" function is combined in the first stage accumulator 110, the logic function means 180 is carried out using an "AND" logical function. An alternate implementation is to include the exclusive "OR" logic function and the "AND" function in the logic function means 180 in which case the sign bit is presented at the input of the exclusive "OR" and "AND" logic function.

The following chart demonstrates the required logical function so that the desired fractional division function controlling the multi-modulus divider can be chosen from the interval between "−1" and "+1".

| LOGIC INPUT | | LOGIC OPERATION | | |
|---|---|---|---|---|
| SIGN | C1 | D1 | D0 | LOGIC OUTPUT |
| 0 | 0 | 0 | 0 | 0 |
| 0 | 1 | 0 | 1 | +1 |
| 1 | 1 | 1 | 1 | −1 |
| 1 | 0 | 0 | 0 | 0 |

It is preferable to use a register in the feed forward paths between the output 114 of the accumulator 110 and the input 130 of the accumulator 132 and a register between the output 134 of the accumulator 132 and the input 150 of the accumulator 152. The use of registers in the feed forward paths to the following accumulator stages permit the delta-sigma modulator to operate at a higher clock frequency. In typical PLL applications, the delta-sigma modulator operates at the same high clock frequency (for example, 100 MHz) as the phase detector circuit. The addition of registers to the output is an accepted logic design and is a well-known synchronous design method.

Figure 5:
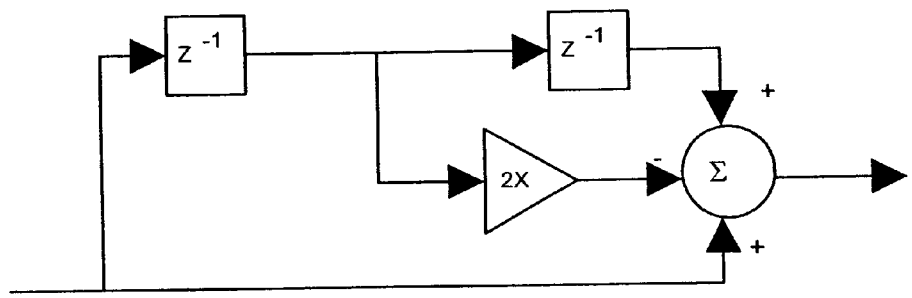
FIG. 5 is a schematic representation of one embodiment of the differentiator transfer function implementation used in the present invention.

The delta-sigma modulator structure shown in FIG. 4, is a viable implementation of the invention. The only difficulty is to determine or know the size of the adding or summing components and registers in the required differential calculation. It is preferable to separate and perform the differential calculations for each of the stages' overflow information by breaking the equation into pieces in which case the fixed coefficients are determined for the summing function. The transfer function D(z) of the differentiator is well known in Z-domain and defined as $D(z)=1-z^{-1}$. It follows that the transfer function to two consecutive differentiators is given as $H(z)=(1-z^{-1})^{-2}=(1-z^{-1})*(1-z^{-1})=1-2z^{-1}+z^{-2}$. The transfer function can be implemented as shown in FIG. 5.

Turning now to FIG. 6, an alternate embodiment of a digital delta-sigma modulator for use in a fractional-N frequency synthesizer is illustrated therein and generally designated 300. The delta-sigma modulator 300 is comprised of three cascaded stages of delta-sigma modulators 302, 304, 306 to provide a third order delta-sigma modulator. The implementation is based upon the method of a cascaded sequence of latched accumulators 310, 330, 350 corresponding to the delta-sigma modulator stages 302, 304, 306, respectively. An N-bit input word representing the desired channel frequency on the line 312 is coupled to the input 314 of the accumulator 310. The output 314 of the accumulator 310 is coupled to the input 316 of the register 318 in the feed forward path of the accumulator 310. The output 320 of the register 318 is coupled to the input 322 of the accumulator 310 and to the input 332 of the accumulator 330 of the second cascaded stage 304. The output 334 of the accumulator 330 is coupled to the input 336 of the register 338. The output 340 of the register 338 is coupled to the input 342 of the accumulator 330 and to the input 352 of the accumulator 350. The output 354 of the accumulator 350 is coupled to the input 356 of the register 358. The output 360 of the accumulator 358 is coupled to the input 362 of the accumulator 350. A SIGN bit control word on the line 370 is coupled to the input 372 of the accumulator 310 for use in selection of the desired channel as discussed above in connection with the embodiment illustrated in FIG. 4. The carry output signal C1 at the output 374 of the accumulator 310 is coupled through delay registers 376, 378, 380 to the carry input 384 of a logic function means 386. The SIGN output 388 of the accumulator 310 is coupled through registers 390, 392, 394 to the input 398 of the logic function means 386, where the SIGN signal is logically combined with the carry signal C1 at the input 384 to the logic function means to provide a "−1", "0" or "+1" at the output 400 of the logic function means 386.

The carry signal C2 at the output 402 of the accumulator 330 of the second cascaded delta-sigma modulator stage 304 is coupled through four registers 406, 408, 410 to the input 412 of the differentiator 414. The output 416 of the register 408 is coupled to the "+1" input 418 of the differentiator 414. The carry signal C3 at the output 440 of the accumulator 350 is coupled through four registers 444, 446, 448 to the "+1" input 450 of the adder function block 452. The output 454 of the register 446 is coupled to the "−2" input 456 of the adder function block 452. The output 458 of the register 444 is coupled to the "+1" input 460 of the adder function block 452. The output 400 of the logic function circuit 386 is coupled to the input 462 of the adder 464. The output 466 of the adder 414 is coupled to the input 468 of the adder 464. The output 470 is the resultant sum of the signals at the inputs 462, 468. The output 470 is coupled to the input 472 of the adder 474 and the output 476 of the adder 452 is coupled to the input 478 of the adder 474. The inputs 472, 478 are logically added together and the output 480 of the adder 474 is coupled to the lead 482 to provide the delta-sigma modulator output control to the multi-modulus divider. In the illustrated embodiment, the multi-modulus divider control output generated by the delta-sigma modulator 300 to achieve the desired fractional is a 4-bit control word. The accumulators 310, 330, 350 are latched such that upon the occurrence of a clock pulse, data is transferred through each accumulator one clock pulse step at a time. The carry outputs 374, 402, 440 are coupled through the delay registers equal to one less delay than the number of accumulators. All the higher order accumulator carry outputs 402, 440 add to a net summation of zero so as to not upset the desired fractional setting of the first accumulator 310. The fixed coefficients are taken directly from Pascal's triangle concerning the order of the accumulator.

A digital delta-sigma modulator for use in the fractional-N frequency synthesizer has been described above in several preferred embodiments. It will be understood that numerous changes in modifications may be made to the examples described above by those skilled in the art, for example, other delta-sigma modulator circuit topologies may be used and the order of the delta-sigma modulators may be higher order than the exemplary third order described without departing from the spirit and scope of the invention. Therefore, the invention has been described by way of illustration rather than limitation.

What is claimed is:

1. A digital delta-sigma modulator for controlling a multi-modulus divider in a fractional-N frequency synthesizer, comprising:

a plurality of delta-sigma modulator stages cascaded in a feed-forward circuit topology and defining an Nth order delta-sigma modulator;

input means for receiving a N-bit input control word defining a desired frequency for selection, said desired frequency having an integer component part and a fractional component part;

sign-bit input means for receiving a direction signal indicating the desired frequency is selected by adding said fractional component part to said integer part or by subtracting said fractional component part from said integer part; and logic means coupled to said delta-sigma modulator stages for detecting and determining the amount and direction of a frequency from the desired frequency to produce a weighted M-bit output multi-modulus divider control word.

2. The digital delta-sigma modulator defined in claim 1 wherein said feed forward cascaded circuit topology comprises a cascaded sequence of delayed accumulators.

3. The digital delta-sigma modulator defined in claim 1 wherein said feed forward cascaded circuit topology comprises a pipelined accumulator topology wherein the input control word is pipe shifted and the output control word is align shifted.

4. The digital delta-sigma modulator defined in claim 2 wherein said logic means further comprises timing compensation registers in the carry overflow signal output of the accumulator and differentiatory circuit means for performing a differential calculator on the carry overflow signal output.

5. The digital delta-sigma modulator defined in claim 4 further comprising said differentiator circuit means including a cascaded sequence of differentiators.

6. The digital delta-sigma modulator defined in claim 1 wherein said N-bit input control word is in a two's complement format.

7. The digital delta-sigma modulator defined in claim 1 wherein said N-bit input control word is dithered to produce an average zero dither N-bit input control word.

8. The digital delta-sigma modulator defined in claim 7 wherein said N-bit control word is dithered as a sinewave signal in a two's complement format.

9. A delta-sigma modulator for controlling a multi-modulus divider in a fractional-N frequency synthesizer, comprising:

a plurality of cascaded feed forward accumulators wherein the number of said plurality of accumulators is the order of the delta-sigma modulator;

the first accumulator of said plurality further comprising:

a first input for receiving an N-bit modulation data signal representative of a desired channel frequency selection;

a second input for receiving a SIGN-bit control word representative of the direction for adding or subtracting a frequency offset to a fixed frequency to generate the frequency corresponding to the desired selected channel frequency;

a feed forward output coupled to the input of a first next following accumulator of said plurality of accumulators;

a first carry signal C1 output indicative of an overflow or underflow condition, and a SIGN bit signal output indicative of the direction of the overflow;

logic means for combining said first carry signal C1 and said SIGN bit signal and generating a first logic output control word in response thereto;

said first next following accumulator further comprising:
- a feed forward output coupled to the input of a second next following accumulator, and
- a second carry signal C2 output indicative of an overflow or underflow condition;

said second next following accumulator further comprising:
- a feed forward output coupled to a feedback input, and
- a third carry signal C3 output indicative of an overflow or underflow condition;
- means for summing the carry output signals C2 and C3 from said first next following and second next following accumulators, respectively such that the carry output signals add to a net summation equal to zero, and
- means for adding the resultant carry output signal C2 and C3 summation to said first logic output control word to provide a multi-modulus division function control word.

10. The delta-sigma modulator as defined in claim 9 wherein said N-bit modulation data signal is in a two's complement format.

11. The delta-sigma modulator as defined in claim 10 wherein said N-bit modulation data signal is dithered to produce an average zero dither.

12. The delta-sigma modulator as defined in claim 9 wherein said means for summing further comprises a differentiator.

13. The delta-sigma modulator as defined in claim 9 further comprising:

each of said feed forward outputs being coupled through a respective delay register;

said first carry signal C1 being coupled through a plurality of delay registers;

said SIGN bit signal output being coupled through a second plurality of delay registers;

said second carry signal C2 being coupled through a third plurality of delay registers; and said third carry signal C3 being coupled through a fourth plurality of delay registers.

* * * * *